(12) United States Patent
Kovatchev et al.

(10) Patent No.: US 9,977,095 B2
(45) Date of Patent: May 22, 2018

(54) METHOD AND APPARATUS FOR THE DIAGNOSIS OF A FAULTY LIGHT-EMITTING MEANS

(71) Applicant: CONTINENTAL AUTOMOTIVE GMBH, Hannover (DE)

(72) Inventors: Emil Kovatchev, Vienna (AT); Christian Stoeger, Vienna (AT)

(73) Assignee: Continental Automotive GmbH, Hannover (DE)

( * ) Notice: Subject to any disclaimer, the term of this patent is extended or adjusted under 35 U.S.C. 154(b) by 0 days. days.

(21) Appl. No.: 14/435,947

(22) PCT Filed: Oct. 10, 2013

(86) PCT No.: PCT/EP2013/071190
§ 371 (c)(1),
(2) Date: Apr. 15, 2015

(87) PCT Pub. No.: WO2014/060288
PCT Pub. Date: Apr. 24, 2014

(65) Prior Publication Data
US 2015/0301128 A1 Oct. 22, 2015

(30) Foreign Application Priority Data
Oct. 15, 2012 (DE) .................. 10 2012 218 772

(51) Int. Cl.
*H05B 33/08* (2006.01)
*H01L 23/36* (2006.01)
*G01R 31/44* (2006.01)

(52) U.S. Cl.
CPC .............. *G01R 31/44* (2013.01); *H01L 23/36* (2013.01); *H05B 33/0893* (2013.01); *H01L 2924/0002* (2013.01)

(58) Field of Classification Search
CPC .......................... G01R 31/44; G01R 31/2635
See application file for complete search history.

(56) References Cited

U.S. PATENT DOCUMENTS 4,456,963 A * 6/1984 Wiggins ................ G01M 15/08
701/102
2003/0085712 A1 5/2003 Fleury
2003/3085712 5/2003 Christophe Fleury et al.
(Continued)

FOREIGN PATENT DOCUMENTS

CA 2406582 A1 5/2003
CN 101669405 A 3/2010
(Continued)

*Primary Examiner* — Noam Reisner
(74) *Attorney, Agent, or Firm* — Laurence A. Greenberg; Werner H. Stemer; Ralph E. Locher

(57) ABSTRACT

A method and a device for the diagnosis of faulty light emitting diodes in a string (2) formed of at least two light emitting diodes. The light emitting diodes (3) are divided into at least two groups and an electrical measured variable is determined for each group with respective measurement units. Differences between the measured variable and a reference value are established per group and, by way of a diagnosis unit that is connected to the measurement units, a defect of a light emitting diode is identified on the basis of the ratio of the differences in the groups and signaled.

13 Claims, 5 Drawing Sheets

(56) References Cited

U.S. PATENT DOCUMENTS

| | | | |
|---|---|---|---|
| 2004/0070990 A1* | 4/2004 | Szypszak | G01N 21/8806 |
| | | | 362/555 |
| 2005/0104740 A1* | 5/2005 | Stokes | B64D 10/00 |
| | | | 340/815.45 |
| 2005/0242822 A1 | 11/2005 | Klinger | |
| 2006/0170287 A1 | 8/2006 | Ito et al. | |
| 2007/0132407 A1* | 6/2007 | Namba | H05B 33/0815 |
| | | | 315/312 |
| 2007/0159118 A1 | 7/2007 | Kajita et al. | |
| 2010/0117656 A1 | 5/2010 | Snelten | |
| 2010/0264828 A1* | 10/2010 | Cortigiani | H05B 33/0887 |
| | | | 315/130 |
| 2011/0234114 A1* | 9/2011 | Miskin | F21K 9/27 |
| | | | 315/192 |
| 2012/0206146 A1 | 8/2012 | Avenel | |
| 2013/0241410 A1 | 9/2013 | Sakuma | |

FOREIGN PATENT DOCUMENTS

| | | |
|---|---|---|
| CN | 101762772 A | 6/2010 |
| DE | 10107578 A1 | 8/2002 |
| DE | 102007001501 A1 | 7/2007 |
| DE | 102008008217 B4 | 8/2008 |
| DE | 102010002707 A1 | 11/2010 |
| DE | 102011053491 A1 | 10/2012 |
| EP | 1942707 A1 | 7/2008 |
| JP | 2008016302 A | 1/2008 |

* cited by examiner

METHOD AND APPARATUS FOR THE DIAGNOSIS OF A FAULTY LIGHT-EMITTING MEANS

BACKGROUND OF THE INVENTION

Field of the Invention

The invention relates to a method and a device for the diagnosis of a faulty light-emitting means in a string having at least two light-emitting means, in particular light-emitting diodes, the light-emitting means being divided into at least two groups and an electrical measurement variable being determined for each group or measuring means for determining an electrical measurement variable being assigned to each group.

In light-emitting means having special failure patterns, for example light-emitting diodes (LEDs), it has hitherto been possible to detect faults or failures only with a considerable amount of circuitry complexity. It is thus thoroughly possible that, although such light-emitting means no longer emit light, they nevertheless remain conductive and current therefore continues to flow through a string and the latter is operable. At the same time, the use of LEDs or LED groups, for example in automotive technology, is becoming more and more attractive on account of the high life expectancy, the compact and robust design and the high efficiency with falling prices, in which case a wide variety of fields of application from interior lighting to main and signal light sources are possible. The light sources used must often comply with safety regulations, for example a minimum brightness requirement. Reliable diagnosis of failures of already individual light-emitting means or of faulty light-emitting means is therefore essential and often even has legal relevance.

One solution approach would be to measure the forward voltage of each individual light-emitting means in a string and to compare it with a nominal voltage value specific to the respective light-emitting means. This is complicated by the temperature dependence of the forward voltage that is fundamentally required in LEDs, which is exposed to conventionally considerable fluctuations within the temperatures of −40° C. to 125° C. to be taken into account in the motor vehicle sector. In addition, estimation of the relevant temperature inside the light-emitting means (for example in the barrier layer of the LED) is only indirectly possible and is therefore accordingly inaccurate and unreliable.

A circuit arrangement for detecting a short circuit of light-emitting diodes is shown in DE 10 2008 008 217, in which case an electronic switch for monitoring purposes is assigned to each LED; depending on the state of the LED, that is to say normal operation or short circuit, each switch changes over between an open state and a closed state. The voltage drop changed thereby is detected. The generally inaccurate and non-adjustable response thresholds of the monitoring elements and the high price, for example of JFET transistors, and the necessarily large number of components are disadvantageous in this case. In addition, the evaluation is purely analog and is consequently dependent on the temperature and component tolerance and is inaccurate and cannot be parameterized.

BRIEF SUMMARY OF THE INVENTION

In contrast, the object of the invention is to propose a reliable, simple and economic technique for diagnosing the failure of one or more LEDs.

The method according to the invention of the type cited at the outset achieves this object by virtue of the fact that changes in the measurement variable in comparison with a reference value are determined for each group and a defect in a light-emitting means is detected using the ratio of the changes in the groups and is signaled.

In the corresponding device according to the invention, a diagnostic unit for comparing changes in the measurement variables with a reference value is connected to the measuring means of the at least two groups.

This method or this device has the advantage that the amount of monitoring remains the same for an increasing number of light-emitting means in each group, in particular does not increase in proportion to the number of light-emitting means. In addition, the monitoring is independent of component fluctuations since only changes in measurement variables are evaluated, but not their absolute magnitude. Furthermore, as long as all groups are exposed to the same influences, the monitoring functions independently of environmental influences since the diagnosis is given on the basis of the change ratio of the measurement variables. The method or the device is consequently based on the assumption that the same behavior can be observed under identical conditions in separate groups and therefore there is a substantially constant ratio between the changes in the evaluated measurement variable.

The measurement variable may preferably be an electrical voltage, the voltage drop across each group being determined and any change in said voltage drop being determined. It is advantageous to measure the electrical voltage, in particular, when the light-emitting means are supplied by a constant current source, the light-emitting means preferably being connected in series in this case, which corresponds to a conventional control concept in LEDs, for example.

When carrying out the present method, it has proved to be favorable if, in order to detect a defect in a light-emitting means, the ratio of the changes in the measurement variables is compared with the ratio of the number of light-emitting means in each group and a defect is signaled if there is a discrepancy. The monitoring can therefore be easily adapted to a current number of light-emitting means and the constant ratio of the changes need not be newly determined for each configuration. It goes without saying that this simple solution can be used only in entirely identical light-emitting means.

Since not exactly identical environmental conditions can usually be achieved in practice for separate groups, it is advantageous if a defect is signaled only in the case of a discrepancy outside a tolerance range. The tolerance range may also be needed to also take into account component tolerances which occur in identical light-emitting means, and unavoidable measurement errors, for example caused by quantizations, offset currents or resistances which have not been taken into account, can finally also be expected as part of the measurement. When choosing the tolerance range, the described discrepancies during normal operation must be weighed up against the expected change in the measurement variable, for example a maximum LED forward voltage, in the event of a fault.

So that the objective method can diagnose faults, that is to say discrepancies from a fault-free behavior, with great reliability, the reference values for the groups are preferably determined and stipulated immediately after an optical and electrical inspection of the string. In this manner, namely when already stipulating the reference value at the production time, it is possible to avoid the reference values already corresponding to a fault and the existing fault therefore not being able to be detected since no corresponding changes in the measurement variable (in comparison with the erroneous reference value) could be determined.

In order to obtain reference values which are as reproducible as possible, current pulses in the microsecond range can be used to determine the reference values. The use of short current pulses has the advantage that the light-emitting means are therefore scarcely heated and the measurement variable can be determined independently of temperature influences, in particular temperature-related interactions between the light-emitting means, and can be stipulated as the reference value. It is likewise advantageous if similarly short current pulses are used to determine the measurement variables during a function test, for example when starting up a vehicle equipped with the device, since lighting-up of the tested light-emitting means thus is not visible or scarcely visible to the human eye.

Since a high life expectancy and high efficiency can be achieved with these with relatively low costs, it is favorable if the light-emitting means are light-emitting diodes (LEDs), preferably LEDs of the same design, type and color. A particularly pronounced temperature dependence of the forward voltage can be observed in LEDs, with the result that, under certain circumstances, it is not possible to distinguish between a fault and a temperature increase with a full function solely on the basis of a voltage measurement. Therefore, the advantages of the device according to the invention are particularly apparent in interaction with LEDs, in particular as far as the compensation for or independence from environmental conditions is concerned.

In order to support the detection principle of the device, it is advantageous if all light-emitting means operate under the same conditions or the conditions for the groups are at least symmetrical. It is therefore possible to provide a thermal connection between the light-emitting means. In this case, the thermal connection may preferably be set up for uniform temperature distribution to all light-emitting means or at least for symmetrical temperature profiles between the groups of light-emitting means.

One preferred variant of the thermal connection between the light-emitting means is to provide a common cooling area for the light-emitting means. Since the light-emitting means usually require cooling anyway, common cooling or a common cooling area can result in the desired temperature distribution in a simple manner and without any additional effort.

If the light-emitting means are arranged together with the measuring apparatuses and the diagnostic unit on a single printed circuit board (PCB), the device according to the invention can be produced in a particularly cost-effective manner. The structural unit of the light-emitting means and the diagnostic circuit increases the reliability of the entire arrangement since the safety function of the diagnostic unit is permanently associated with the light-emitting means in this case, which reduces the probability of incorrect connections or circumvention of the diagnostic unit.

The entire device can be produced in a particularly flexible, compact and cost-effective manner if the measuring apparatuses and the diagnostic unit are integrated in a microcontroller, the connections of the groups of light-emitting means preferably being connected to inputs of the microcontroller via voltage dividers. When a microcontroller is used, different types of light-emitting means can be detected by means of reparameterization and parameter adaptations are simple and cost-neutral. The tolerance range and the relative measurement can be implemented virtually without any effort. It is also possible to monitor a plurality of strings of light-emitting means depending on the available connections and resources of the microcontroller. The calibration method is also cost-effective in terms of production and only a few components are needed to implement the device on account of the integration of all important elements. Consequently, the device may be in the form of a single-layer layout, which is advantageous, in particular, when using printed circuit boards with aluminum or ceramic substrate carriers which are often required owing to the design and temperature.

With respect to the reference values, when using a microcontroller, it is favorable if the reference values for the measurement variables are stored in a non-volatile memory of the microcontroller. In this case, it is possible to avoid additional components, on the one hand, and it is possible, at the same time, to permanently store a one-off initialization, for example after an optical and electrical inspection of the string, and to use the stored values even after interruptions in the power supply.

BRIEF DESCRIPTION OF THE SEVERAL VIEWS OF THE DRAWING

The invention is explained in yet more detail below using particularly preferred exemplary embodiments, to which the invention is not intended to be restricted however, and with reference to the drawing, in which in detail.

DESCRIPTION OF THE INVENTION

Figure 1:
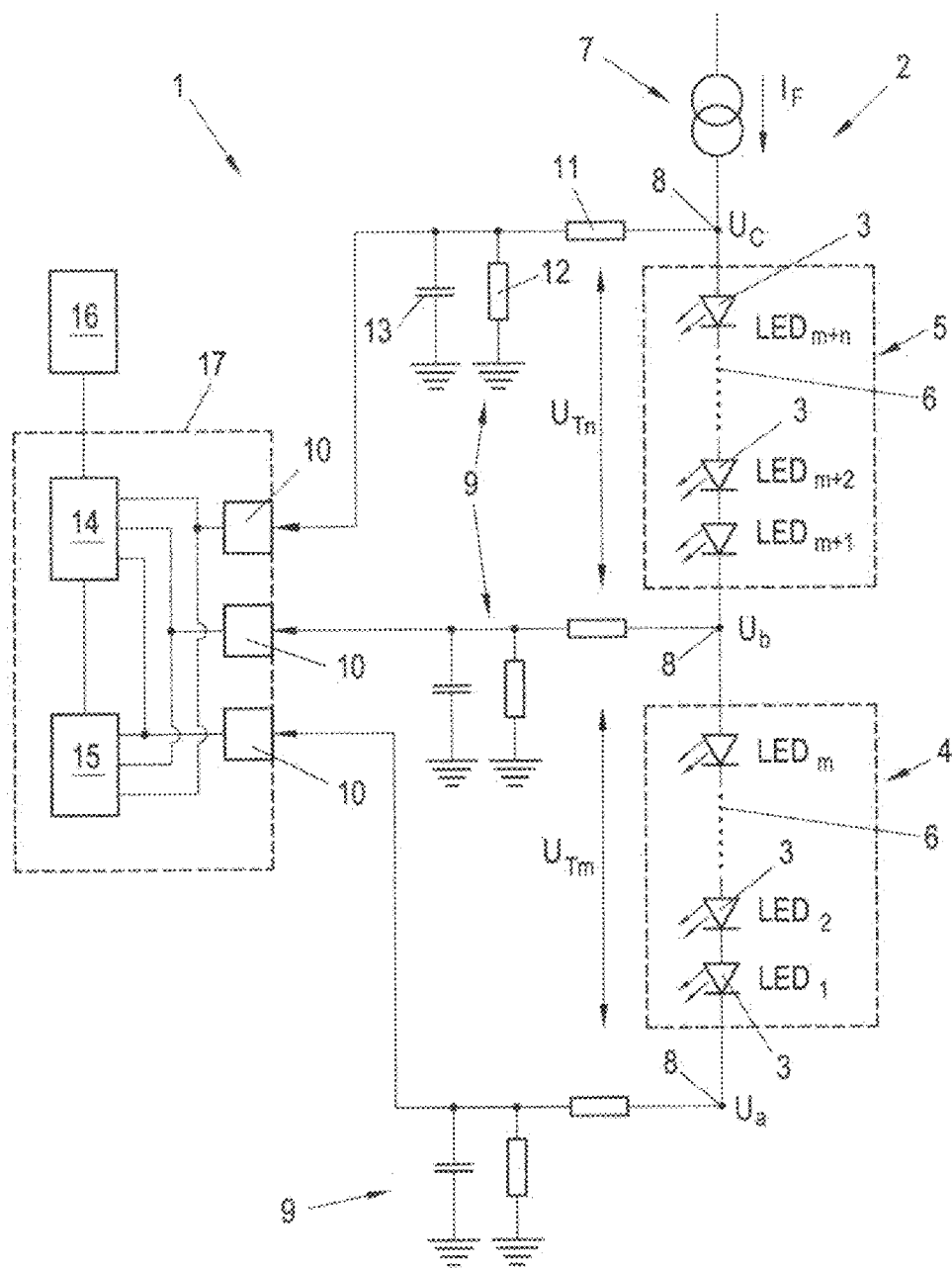
FIG. 1 shows a circuit diagram of an embodiment of the device according to the invention having a string comprising two groups of LEDs.

FIG. 1 shows a device 1 having a string 2 of light-emitting diodes (LEDs) 3. The string 2 is divided into a first group 4 and a second group 5 of LEDs 3. The LEDs 3 in both groups 4, 5 may all be assigned to a particular light function (for example a turn signal of a motor vehicle) in this case. The two groups 4, 5 are connected in series and the LEDs 3 inside the groups 4, 5 are likewise connected in series, with the result that all LEDs 3 in the string 2 are connected in series. Even if only three LEDs 3 are depicted in each case, the dashed line sections 6 between the LEDs 3 are intended to indicate that more than three LEDs 3 may be provided in each group 4, 5. Generally, the first group 4 has a number of m LEDs 3 and the second group 5 has a number of n LEDs 3. The current flowing across the total of m+n LEDs 3 is provided by a current source 7 which generates a current $I_F$. The voltage drop across the first group 4 is denoted using $U_{Tm}$ and that across the second group 5 is denoted using $U_{Tn}$.

The string 2 is connected, at three nodes 8 having the potentials Ua, Ub and Uc, to measuring means 10 via a voltage divider 9 in each case, which measuring means are formed by analog/digital converters in the example illustrated. The group voltages $U_{Tn}$, $U_{Tm}$ dropped across the two groups 4, 5 each correspond to a difference between potentials, that is to say $U_{Tn}=Uc-Ub$ and $U_{Tm}=Ub-Ua$. For identical light-emitting means or LEDs 3, as in this example, the group voltages $U_{Tn}$, $U_{Tm}$ are directly proportional to the number m, n of light-emitting means 3 in each group 4, 5.

The three voltage dividers 9 connected to the measuring means 10 each have a series resistor 11 and a shunt resistor 12 as well as a capacitor 13 in parallel with the shunt resistor 12 and are connected to a common ground of the measuring means 10, with the result that the voltages at the potentials Ua, Ub and Uc are each scaled in the operating range of the measuring means 10 and meet any common-mode requirements. It is therefore also possible to diagnose LED chains which are operated in a "floating" manner with respect to ground, as would be the case with a buck-boost LED converter as the current source 7, for example.

A voltage proportional to the group voltages $U_{Tn}$, $U_{Tm}$ is respectively calculated in a diagnostic unit 14 using the voltages applied to and measured at the measuring means 10. For the sake of simplicity, these calculated and actually scaled—according to the configuration of the voltage dividers 9—voltages are identified below with the group voltages $U_{Tn}$, $U_{Tm}$. A constant scaling factor which would be canceled out during evaluation of the voltage ratios results with corresponding dimensioning of the resistances 11, 12 and capacitances 13.

A condition for fault-free operation of the string 2 can be formulated on the basis of the group voltages $U_{Tn}$, $U_{Tm}$ and forms the basis of a preferred embodiment of the method according to the invention:

$$\frac{m}{n}\left(1 - \frac{t}{100}\right) \leq \left|\frac{U_{Tm} - U_{CAL,m}}{U_{Tn} - U_{CAL,n}}\right| \leq \frac{m}{n}\left(1 + \frac{t}{100}\right) \quad (1)$$

In this case, in addition to the number m, n of light-emitting means 3 in each group 4, 5 and the respective group voltages $U_{Tm}$, $U_{Tn}$, a tolerance parameter t and a reference voltage value $U_{CAL,m}$, $U_{CAL,n}$ for each group 4, 5 are also included. In this case, the tolerance parameter t defines a symmetrical tolerance range on both sides of the expected ratio according to $$\left|\frac{U_{Tm} - U_{CAL,m}}{U_{Tn} - U_{CAL,n}}\right| \approx \frac{m}{n} \quad (2)$$

where t in equation (1) is a placeholder for the permissible total tolerance of the failure detection in percent. A symmetrical tolerance range means that failures in a group 4, 5 are detected under the same conditions as failures in another group 5, 4.

The group voltages $U_{Tm}$, $U_{Tn}$ are determined periodically during operation. The reference voltage values $U_{CAL,m}$, $U_{CAL,n}$ correspond to a voltage drop $U_{Tm}$, $U_{Tn}$ in the groups 4, 5, which voltage drop is measured immediately after the LED function test during production and is stored in a memory unit 15 connected to the diagnostic unit 14 and to the measuring units 10. In this case, the function test usually comprises an electrical and optical inspection of all LEDs 3. The reference values $U_{CAL,m}$, $U_{CAL,n}$ are preferably already measured at the production site during the end-of-line test (EOL test) and are stored in a non-volatile memory 15 during the conventional parameterization since this ensures that all LEDs 3 are functioning correctly. Short current pulses in the millisecond range can be used to measure the reference values $U_{CAL,m}$, $U_{CAL,n}$, with the result that self-heating of the LED chips during the reference measurement is largely avoided. The exact LED chip temperature during this measurement or calibration is unknown and is also largely irrelevant to the present method.

Depending on the specific case, the total tolerance or the tolerance range and the tolerance parameter t must be selected on the basis of the information from the LED manufacturer relating to component tolerances and properties and on the basis of the number of LEDs, for example. In this case, it must be taken into account that the resistors of the voltage dividers 9 are also faulty and the measuring units 10 contribute to measurement errors, for example on account of quantization, offset currents and input resistance. These discrepancies must be weighed up against the maximum LED forward voltage stated by the manufacturer in the event of a "short-circuit" fault in order to ensure optimum failure detection.

In order to diagnose a faulty light-emitting means, the condition stated in equation (1) is tested in the diagnostic unit 14 using the tolerance parameter t and the reference values $U_{CAL,m}$, $U_{CAL,n}$ stored in the memory 15. If the test shows that the tolerance range is exceeded, the diagnostic unit 14 outputs a signal to a display unit 16 which draws a user's attention to the failure or malfunction, for example, with the result that the faulty light-emitting means can be repaired or replaced. The display unit may have, for example, a warning light in a vehicle and/or may be part of an on-board computer which can output a more specific warning message.

In the example illustrated here, the measuring units 10 are integrated together with the memory unit 15 and the diagnostic unit 14 in a microcontroller 17. The measuring units 10 correspond to the ADC inputs (analog/digital converter inputs) of the microcontroller 17 and can therefore be easily parameterized; the memory unit 15 corresponds to a non-volatile memory (also non-volatile random-access memory, NVRAM for short) 15 integrated in the microcontroller 17. The condition (1) to be tested and the parameters contained therein can be easily programmed using a standardized interface of the microcontroller 17, for example, and there is no need for any task-specific components. The storage of the reference values $U_{CAL,m}$, $U_{CAL,n}$ can be initiated at the appropriate time, for example via a maintenance interface (not shown) of the microcontroller 17, for example by means of a diagnostic message on a vehicle bus.

Figure 2:
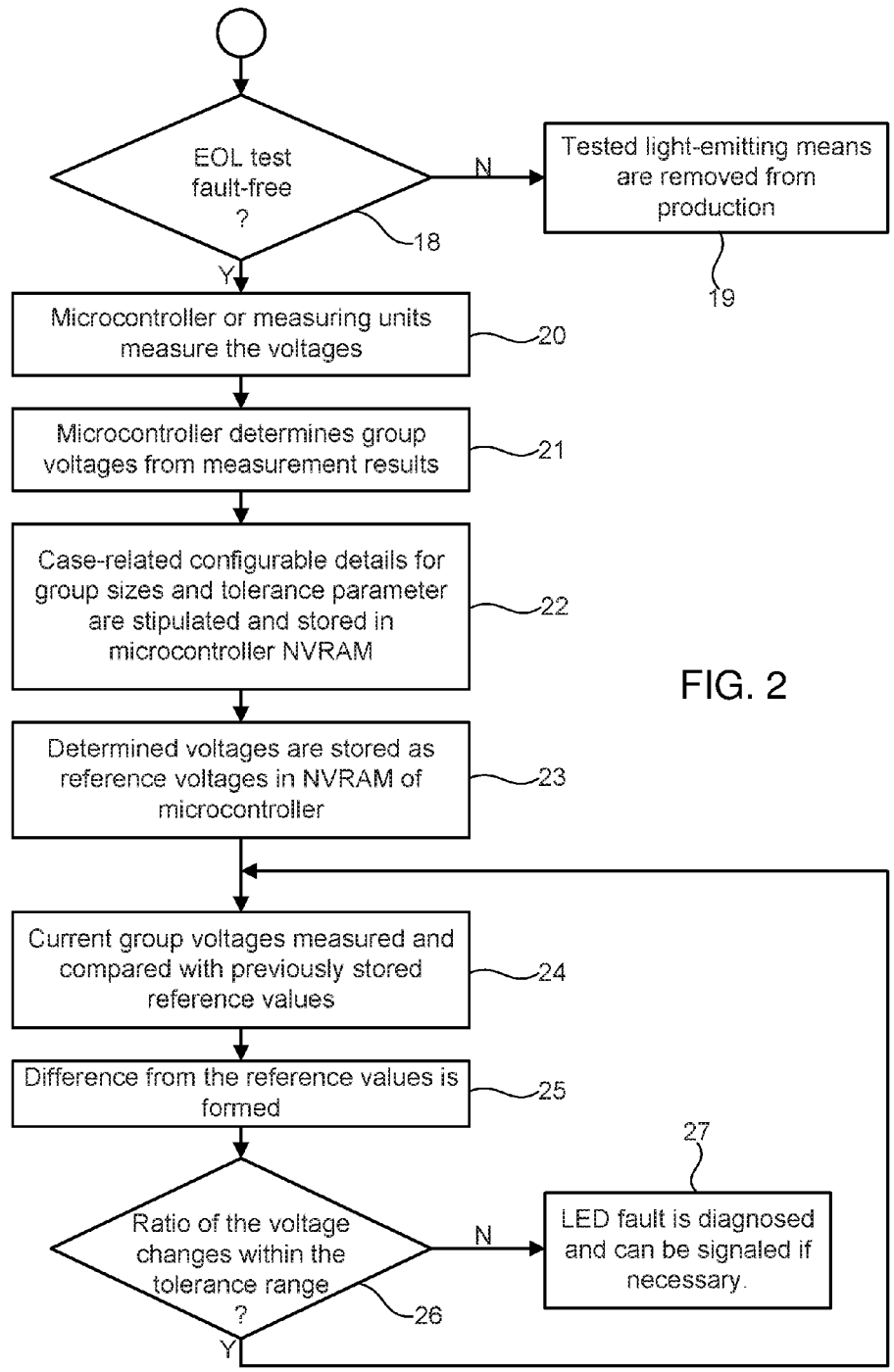
FIG. 2 shows a flowchart for illustrating the method according to the invention together with initialization of the reference values.

The flowchart in FIG. 2 shows, by way of example, the sequence of a method according to the invention for the diagnosis of a faulty light-emitting means. The chart begins immediately after the EOL test, but provision may also be made for the process to return to this point after each reset or each time the light-emitting means is switched on. The first step 18 first of all checks whether the EOL test was fault-free or whether faults in the LEDs 3 were determined. In the second case, see step 19, the method is immediately aborted and the tested light-emitting means are removed from production. If the EOL test was successful, the microcontroller 17 or the measuring units 10 next measure(s) the voltages Ua, Ub and Uc according to step 20. In the subsequent calculation step 21, the microcontroller 17 determines the group voltages $U_{Tm}$, $U_{Tn}$ from the measurement results. During parameterization, step 22, the case-related configurable details for the group sizes m, n of the LED string 1 and the tolerance parameter t are stipulated and stored in the microcontroller NVRAM 15. In order to conclude the initialization sequence, see step 23, the determined voltages are stored as reference voltages $U_{CAL,m}$, $U_{CAL,n}$ in the NVRAM 15 of the microcontroller 17.

The first measuring cycle begins after initialization. In this case, according to step 24, the current group voltages $U_{Tm}$, $U_{Tn}$ are first of all measured and are then compared with the previously stored reference values $U_{CAL,m}$, $U_{CAL,n}$ or the difference from the reference values is formed according to step 25. The ratio of these differences is subjected to a test in step 26 according to the condition stated in equation (1). If this test is successful, that is to say if the ratio of the voltage changes is within the tolerance range, the next measuring cycle is initiated—possibly with a predetermined delay—with a new measurement, step 24. If the condition (1) has not been complied with, an LED fault is diagnosed according to step 27 and this fault can therefore be signaled if necessary.

In principle, other group divisions, that is to say with more than two groups 4, 5, may also be provided for a light function. This is indicated in FIG. 3 and FIG. 4 using schematic block diagrams.

Figure 3:
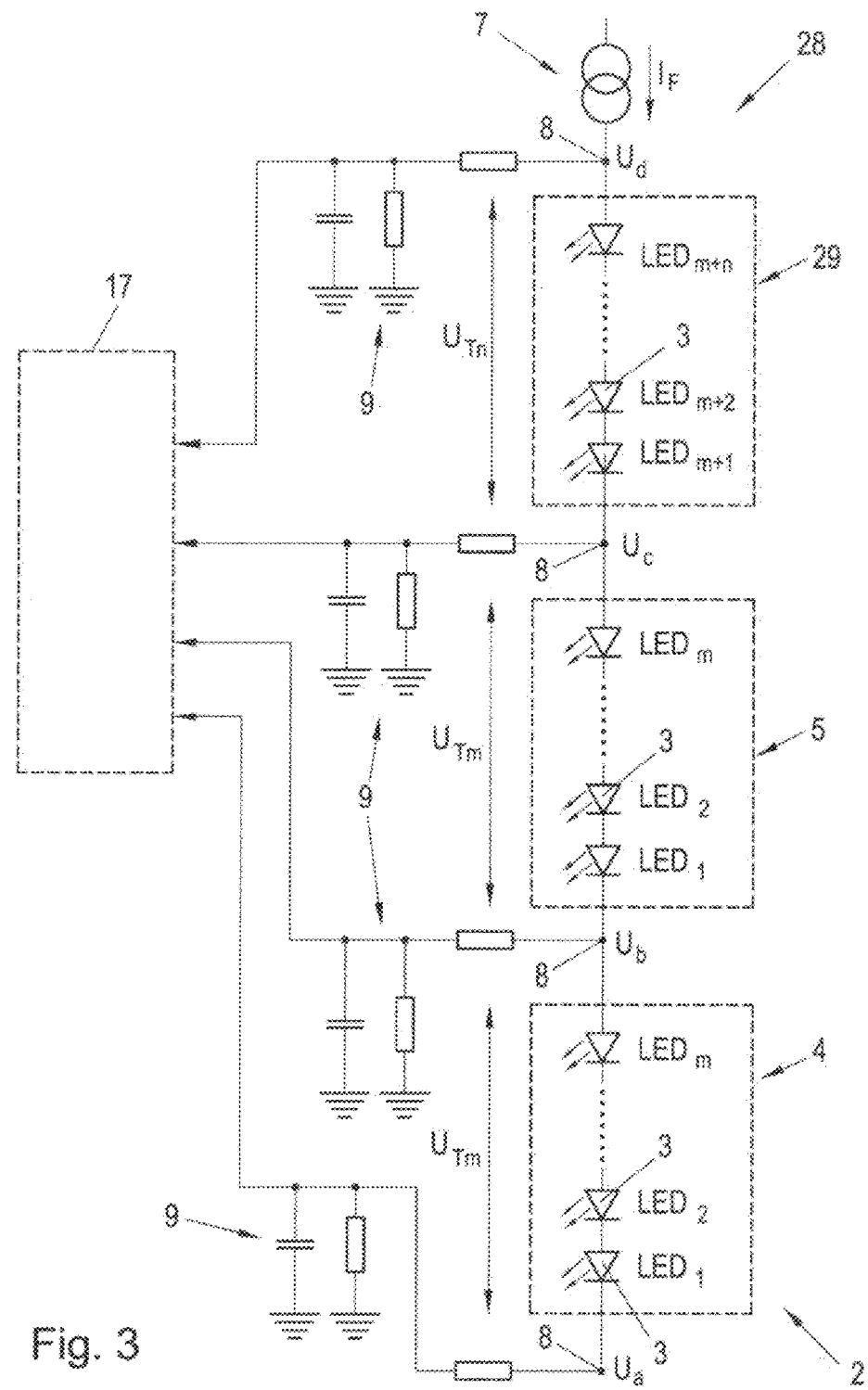
FIG. 3 shows a circuit diagram of a variant of the device according to the invention having a string comprising three groups of LEDs.

In the circuit 28 shown in FIG. 3, a single string 2 of LEDs 3 connected in series is divided into three groups 4, 5, 29, the microcontroller 17 being connected to the string 2 at a total of four nodes 8 for voltage measurements. The entire string 2 is supplied by a single constant current source 7. The connections between the string 2 and the measuring units 10 or microcontroller 17 are also established via voltage dividers 9 in this example. In the case of four measurements, it is either possible to reject one of the two middle measurements, thus effectively merging two groups 4, 5, 29, or to compare some or all group combinations in pairs. An advantage which arises with the division into more than two groups 4, 5, 29 with comparison of all possible pairs in pairs is the detection of the faulty group 4, 5, 29, that is to say it is possible to determine and state the group 4, 5, 29 to which the faulty light-emitting means is assigned. In addition, in the case of several and smaller groups 4, 5, 29, the probability of a light-emitting means 3 failing in all groups 4, 5, 29 at the same time is lower, which could otherwise be a fault which cannot be detected by the present method.

Figure 4:
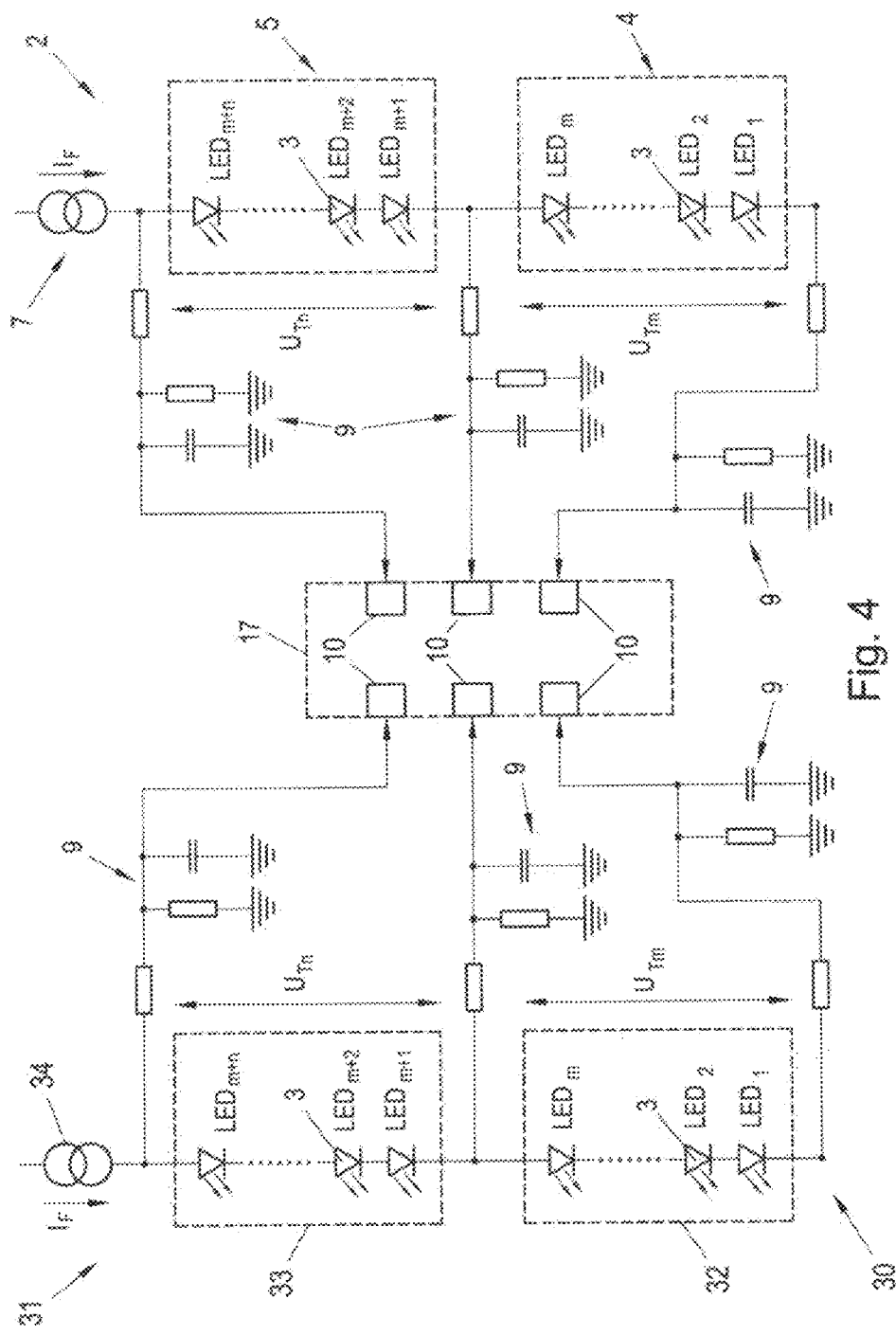
FIG. 4 shows a circuit diagram of a further variant of the device according to the invention having two strings each comprising two groups of LEDs.

As shown using the variant 30 in FIG. 4, an individual microcontroller 17 can also monitor a plurality of strings 2, 31, however, if the corresponding number of inputs 10 is available. The two strings 2, 31 shown in FIG. 4 each have two groups 4, 5, 32, 33 of LEDs 3 connected in series. Each string 2, 31 is supplied by its own constant current source 7, 34 and is connected to a respective ADC input 10 of the microcontroller 17 at the start and at the end as well as between the two groups 4, 5, 32, 33 via voltage dividers 9. Since the voltages to be measured are referenced with respect to the microcontroller ground on account of the voltage dividers 9, the two current sources 7, 34 may operate independently and in a "floating" manner. The principle of diagnosis is identical to the case of only one string 2, but, when a fault is diagnosed, this fault is favorably assigned to one string 2, 31 in order to make it possible to quickly and efficiently eliminate said fault.

The knowledge on which the present method is based can be most easily understood assuming identical LEDs 3. Under this assumption, each group voltage $U_{Tm}$, $U_{Tn}$ corresponds to the sum of approximately identical LED forward voltages which are dependent on the temperature. Apart from the temperature, the individual forward voltages also depend on a number of technology-related and material-related parameters and process properties when producing the LED chips. However, since only the ratio of the group voltages $U_{Tm}$, $U_{Tn}$ is evaluated, the temperature dependence or the exact profile of the individual forward voltages is irrelevant as long as the forward voltage in LEDs of the same type and from the same manufacturer is largely constant and highly reproducible and the barrier layer temperature of all LEDs is virtually the same. Only the number of entries in each sum (in the case of LEDs connected in series), that is to say the number m, n of LEDs 3 in each group 4, 5, 29, etc., is then important. In order to exclude distortions caused by temperature-independent factors, it is also expedient, instead of the absolute group voltages $U_{Tm}$, $U_{Tn}$, to compare their discrepancy $\Delta U_m = U_{Tm} - U_{CAL,m}$ or $\Delta U_n = U_{Tn} - U_{CAL,n}$ from a constant reference value $U_{CAL,m}$, $U_{CAL,n}$ measured under identical (temperature) conditions.

A special case of the general relationship between the temperature and the LED forward voltage is a linear profile, in which case a temperature change $\Delta T$ is proportional to a change in the forward voltage $\Delta U$:

$$TC_U \approx \frac{\Delta U}{\Delta T} \qquad (3)$$

The approximately constant proportionality factor $TC_U$ is a temperature coefficient (but realistic temperature coefficients themselves are dependent on the temperature, material, process and current).

The ratio of the voltage changes with respect to a reference value therefore results as $$\left| \frac{U_{T,m} - U_{CAL,m}}{U_{T,n} - U_{CAL,n}} \right| = \left| \frac{\sum_{i=0}^{m} TC_{U,i} \Delta T}{\sum_{i=0}^{n} TC_{U,m+i} \Delta T} \right| \approx \left| \frac{m \overline{TC_U}}{n \overline{TC_U}} \right| \approx \frac{m}{n} \qquad (4)$$

is the median of the temperature coefficients and $\Delta T$ in this case is the temperature difference between the temperature during the reference measurement (reference temperature) and the temperature during diagnosis. In the case of LEDs of the same design and same color (same semiconductor material), the individual temperature coefficients differ only very slightly from this median. The more LEDs 3 the two groups 4, 5 have, that is to say the more entries the sum has, the more exactly equation (4) is complied with since the accuracy of the mean values increases with increasing number of entries. As is clear from equation (4), the present method can also be used for slight (on account of the linear approximation of the temperature influence) temperature differences between the groups, the group temperature being able to be measured in each case and the ratio of the temperature discrepancies (from the reference temperature) of the two groups being able to be accordingly taken into account. Accurate knowledge of the absolute temperature coefficients is not required in this case as long as the temperature coefficients of the two groups are the same.

Figure 5:
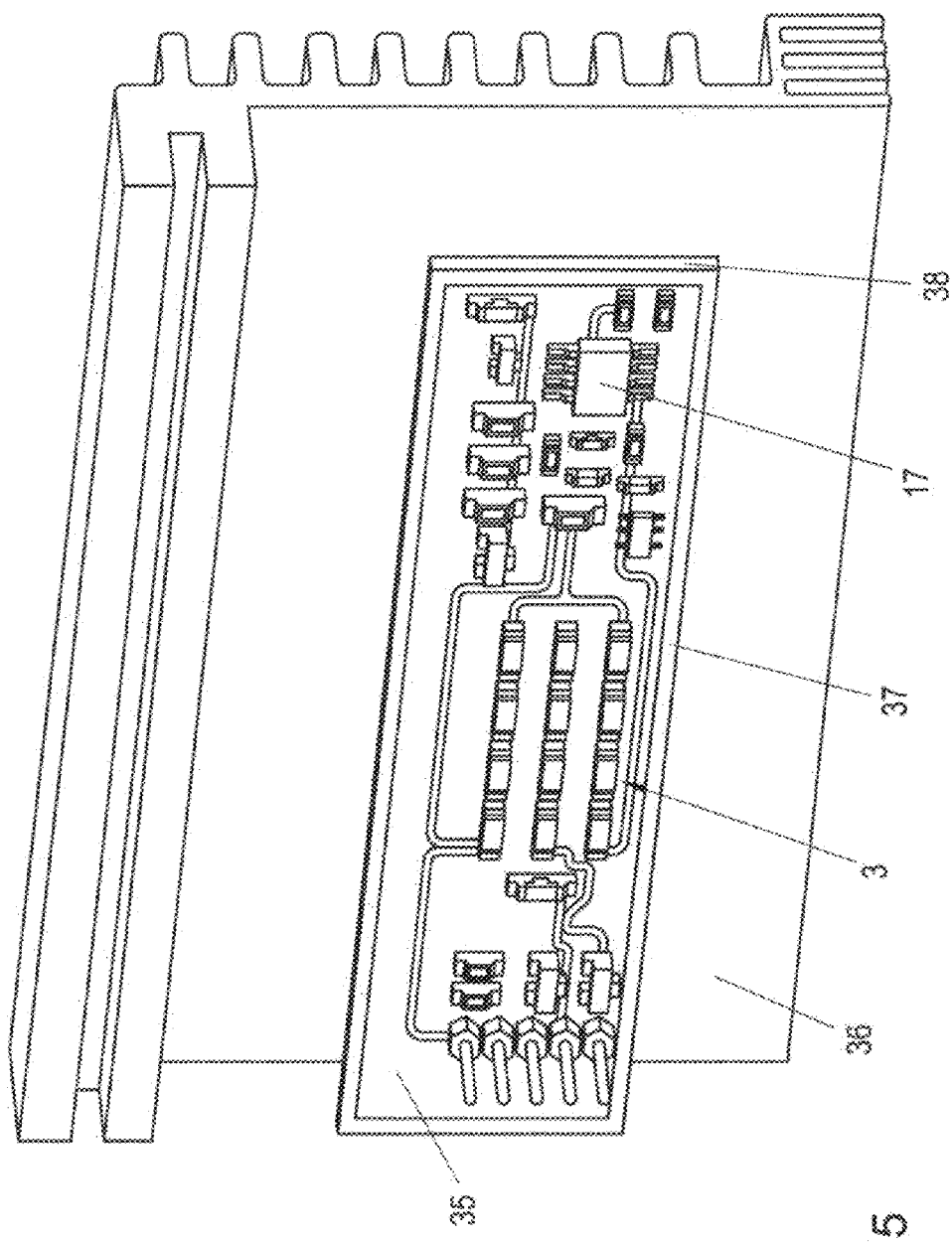
FIG. 5 diagrammatically shows an arrangement of LED groups and associated circuit components on a common printed circuit board having a common heat sink.

As already touched on above, it is desirable to jointly cool the light-emitting means or LEDs 3 in all groups, for example groups 4, 5 or 4, 5, 29 or 4, 5, 32, 33 (see FIGS. 1, 3 and 4, respectively), and to keep them at a common (cooled) temperature. It is expedient to provide a common temperature equalization area for this purpose, which temperature equalization area can be implemented in different ways. One possibility is to fit the LEDs 3, possibly also the other circuit components, on a common printed circuit board (PCB), this printed circuit board (PCB) having a thermally conductive substrate, for example an aluminum substrate, or else a ceramic carrier, with the result that the LEDs 3 then experience approximately the same solder joint temperature. However, it is also conceivable, as shown in FIG. 5, to fit the LEDs 3 and the other circuit components to a common heat sink 36, in particular using a common printed circuit board 35. In the diagrammatic illustration of FIG. 5, a total of 13 LEDs 3 are shown in the central region on the printed circuit board 35, namely in a matrix of 3×4 LEDs 3 plus a separate LED.

The required circuit components, inter alia the microcontroller 17, can also be seen on the printed circuit board 35 according to FIG. 5.

The printed circuit board 35 is mounted on the heat sink 36 by means of adhesive bonding, screwing etc., for example, and the LEDs 3 are cooled with as many plated-through holes in the printed circuit board 35 as possible, in which case the printed circuit board 35 can be thermally connected to the heat sink 36 by means of a conventional gap filler compound, for example.

In this manner, a thermal connection 37 is provided between the light-emitting means (LEDs 3), namely a common cooling area 38 in particular, with the aid of at least the printed circuit board 35.

Quite generally, a heat sink 36 is usually provided in LED units, but this need not necessarily be the case since the temperature is "homogenized" even in the case of a large common printed circuit board 35, with the result that the solder joint temperatures of the individual LEDs 3 are approximately the same even without a heat sink 36.

The invention claimed is:

1. A method for the diagnosis of one or more faulty light-emitting diodes in a string having at least two LEDs connected in series and supplied by a constant current source, the method comprising:
   dividing the LEDs into at least two groups, where no one LED occupies more than one group, and determining an electrical measurement variable for each group, the measurement variable being an electrical voltage;
   providing a thermally conductive connection between all LEDs in all groups, wherein said thermally conductive connection is a thermally conductive substrate or heat sink;
   determining a voltage drop across each group of the at least two groups and determining differences that are formed between each of the measured current group voltages and a respective previously stored reference voltage for each group; and
   detecting a defect in one or more LEDs using a ratio of the differences in the groups and signaling the defect.

2. The method according to claim 1, which comprises, in order to detect a defect in an LED, comparing the ratio of the differences with a ratio of a number of LEDs in each group, and signaling a defect if a discrepancy is found.

3. The method according to claim 2, which comprises signaling a defect only if the discrepancy lies outside a tolerance range.

4. The method according to claim 1, which comprises determining and stipulating the reference values for the groups immediately after an optical and electrical inspection of the string of LEDs.

5. The method according to claim 1, which comprises using current pulses in a microsecond range to determine the group voltages and/or the reference voltages.

6. A device for the diagnosis of one or more faulty LEDs, comprising:
   a string of at least two LEDs connected in series, the LEDs being divided into at least two groups of LEDs, where no one LED occupies more than one group;
   measuring devices configured for measuring an electrical voltage and assigned to each of said at least two groups of LEDs;
   a thermally conductive connection between all LEDs in all groups, said thermally conductive connection being a thermally conductive substrate or heat sink; and
   a diagnostic unit connected to said measuring devices and configured for determining a ratio of differences in the electrical voltages of each of the at least two groups in comparison with previously stored reference voltages at each of the at least two groups.

7. The device according to claim 6, wherein said LEDs are LEDs of a same design, type and color.

8. The device according to claim 6, wherein said LEDs have a common cooling area.

9. The device according to claim 6, wherein said LEDs are arranged together with said measuring devices and said diagnostic unit on a single printed circuit board.

10. The device according to claim 6, wherein said measuring devices and said diagnostic unit are integrated in a microcontroller.

11. The device according to claim 10, wherein connections of said at least two groups of LEDs are connected to inputs of said microcontroller via voltage dividers.

12. The device according to claim 10, wherein the reference voltages are stored in a non-volatile memory of said microcontroller.

13. The device according to claim 6, wherein the thermally conductive connection is between all LEDs in all groups.

* * * * *